United States Patent
Mende et al.

(10) Patent No.: US 7,309,980 B2
(45) Date of Patent: Dec. 18, 2007

(54) CURRENT SENSING CIRCUIT FOR USE IN A CURRENT MEASUREMENT PROBE

(75) Inventors: Michael J. Mende, Portland, OR (US); Albert S. Crane, Jr., Portland, OR (US); Jonathan S. Dandy, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/430,400

(22) Filed: May 8, 2006

(65) Prior Publication Data

US 2007/0257663 A1 Nov. 8, 2007

(51) Int. Cl.
*G01R 33/00* (2006.01)
(52) U.S. Cl. ............... 324/130; 324/117 R; 324/117 H
(58) Field of Classification Search ............ 324/117 R, 324/76.11, 130, 117 H
See application file for complete search history.

(56) References Cited

U.S. PATENT DOCUMENTS

| | | | |
|---|---|---|---|
| 3,525,041 A | 8/1970 | Velsink | |
| 4,266,190 A * | 5/1981 | Lipman | 324/117 R |
| 4,514,685 A * | 4/1985 | Gilker | 324/142 |
| 4,888,562 A | 12/1989 | Edler | |
| 5,477,135 A | 12/1995 | Baker | |
| 5,493,211 A | 2/1996 | Baker | |
| 6,121,768 A * | 9/2000 | Taurand | 324/117 R |
| 6,566,854 B1 | 5/2003 | Hagmann et al. | |
| 6,856,129 B2 | 2/2005 | Thomas et al. | |
| 2004/0100249 A1* | 5/2004 | Mende | 324/117 H |

* cited by examiner

*Primary Examiner*—Minh N. Tang
(74) *Attorney, Agent, or Firm*—William K. Bucher

(57) ABSTRACT

A current sensing circuit has a transformer where a current to be measured induces a magnetic flux into a magnetic core. The magnetic core has a magneto-electric converter for sensing DC to low frequency current signals and a secondary winding for sensing higher frequency current signals. The magneto-electric converter generates an output that is coupled via an amplifier to a non-inverting input of a transimpedance amplifier. The inverting input of the transimpedance amplifier is coupled to the secondary winding of the transformer. A current signal path having a transimpedance resistor couples the inverting input to the output of the transimpedance amplifier. The transimpedance amplifier functions as a power amplifier for coupling a nulling current to the transformer for DC to low frequency current signals and functions as a transimpedance gain amplifier for higher frequency signals.

5 Claims, 1 Drawing Sheet

CURRENT SENSING CIRCUIT FOR USE IN A CURRENT MEASUREMENT PROBE

BACKGROUND OF THE INVENTION

The present invention related generally to current measurement probes and more particularly to a current sensing circuit for use in a current measurement probe.

Current probes generally measure current flow in a conductor by sensing the magnetic flux generated by the flow of current in the conductor using a current sensing circuit. The current sensing circuit converts the sensed current signal to a voltage output signal that is coupled to a measurement test instrument, such as an oscilloscope or the like, for display and analysis. The current sensing circuit generally has a transformer input with the transformer having a ring-shaped core of magnetic material. The primary winding of the transformer is the conductor in which the current is to be measured and is disposed within the ring-shaped magnetic core. The current in the primary winding induces a magnetic flux in the magnetic core. The secondary winding of the transformer is wrapped around the magnetic core and is coupled to a termination resistor. The alternating current flowing in the primary winding of the transformer induces a voltage in the secondary winding that produces an alternating current in a direction causing a magnetomotive force or flux in a direction opposing the input flux. The alternating current in the secondary winding is coupled to the termination resistor that converts the alternating current signal to a voltage signal.

Since transformers are AC signal coupling devices, the passband of the transformer cut-off frequency is above the DC level. To allow the current sensing circuit to sense DC and low frequency current signals, a Hall effect device has been included in the magnetic core of the transformer. The Hall effect device is a semi-conductor positioned in the magnetic core such that the magnetic flux in the magnetic core is substantially perpendicular to the Hall effect device. A bias is applied to the Hall plate and the resulting voltage generated by the Hall effect due to the flux in the magnetic core is coupled to the input of a differential amplifier. The single ended output of the amplifier may be coupled to a power amplifier which generates a current output proportional to the voltage generated by the Hall effect device. The output of the Hall device amplifier or alternately the power amplifier is coupled to the secondary winding of the transformer such that the output current from the amplifier flowing through the secondary winding produces a flux that opposes the input magnetic flux over the frequency passband of the Hall effect device. In one implementation, the output of the amplifier is coupled to one side of the secondary winding with the other side of the winding coupled to the transformer termination resistor and amplifier circuitry. In another implementation, the output of the amplifier is coupled via a resistor to the same side of the secondary as the amplifier circuitry. A capacitor is coupled to the input of a wideband amplifier in the amplifier circuitry for blocking the current from the Hall effect amplifier. The output of the Hall effect amplifier and the output of the wideband amplifier are summed at the input of a operational amplifier having a feedback resistor that provides a voltage output proportional to the combined current in the secondary winding of the transformer. The voltage output of the operational amplifier is a measure of the AC and DC components of the magnetic core flux. U.S. Pat. Nos. 3,525,041, 5,477,135 and 5,493,211 describe the above current sensing circuits.

The sensitivity of the above described current sensing circuits are limited by the turns ratio of the transformer and the Hall effect device. As the number of turns in the secondary winding increases relative to the primary winding, the sensitivity of the overall current sensing circuit decreases. In addition, the inclusion of the transformer termination resistor or the use of a resistor for coupling the output the Hall effect amplifier to the secondary winding of the transformer causes the low frequency cut-off point of the transformer frequency response to increase as a function of L/R where L is the inductance of the secondary winding and R is the resistance of the secondary winding and the transformer termination resistor. This requires that the high frequency cut-off point of the combined Hall effect device and amplifier frequency response to extend to past the low frequency cut-off point of the transformer frequency response for a smooth crossover from DC to low frequency response of the Hall effect device to the high frequency response of the transformer. Further, the prior art designs requires that the Hall effect amplifier provide sufficient current to null the DC to low frequency flux generated in the magnetic core of the transformer. The Hall effect device amplifier provides a current output that generally requires the use of a power amplifier for current probing devices having a maximum current ratings in the tens of amps range.

The '135 and '211 patents suggest that the voltage amplifier circuitry having the transformer termination resistor may be replace with a transimpedance amplifier since the transimpedance amplifier may be used instead to develop a voltage output in response to a current input signal. However, such a current sensing circuit would still require the use of the Hall effect amplifier and power amplifier to generate a bucking current that is applied to the secondary winding of the transformer.

What is needed is a current sensing circuit where the Hall effect amplifier does not generate the current signal that is applied to the secondary winding of the transformer. Further, there is a need for a current sensing circuit that does require the use of a power amplifier for generating the bucking current to null the DC to low frequency flux in the magnetic core of the transformer. Such a circuit should have a high current to voltage gain with low input resistance which increases the sensitivity of the current sensing circuit.

SUMMARY OF THE INVENTION

Accordingly, a current sensing circuit for detecting current flow in a conductor meeting the above described needs has a magnetic core in linking relationship with the conductor, whereby the flow of current in the conductor produces magnetic flux in the core. A magneto-electric converter and a secondary winding are linked by the magnetic flux in the magnetic core with the magneto-electric converter disposed within the magnetic core in a plane substantially perpendicular to the magnetic flux. The magneto-electric converter generates an output responsive to the magnetic flux in the magnetic core that is coupled to an amplifier generating an output representative of the magneto-electric converter output. The secondary winding is responsive to the magnetic flux in the magnetic core for producing an alternating current output. A transimpedance amplifier has an inverting input coupled to receive the alternating current output from the secondary winding and a non-inverting input coupled to receive the output of the magneto-electric converter amplifier. The inverting input of the transimpedance amplifier is coupled to the output of the transimpedance amplifier via a current signal path. The current signal path couples the alternating current in the secondary winding to the output of the transimpedance amplifier and couples a current representing the output the magneto-electric converter from the output of the transimpedance amplifier to the secondary winding.

The current sensing device as recited in claim 1 preferably has a primary winding coupled to the conductor for linking the magnetic core to the flow of current in the conductor. Alternately, the conductor functions as a primary winding for linking the magnetic core to the flow of current in the conductor. The magneto-electric converter is preferably a Hall effect device. An offset voltage may be coupled to the non-inverting input of the transimpedance amplifier.

The objects, advantages and novel features of the present invention are apparent from the following detailed description when read in conjunction with appended claims and attached drawings.

DETAILED DESCRIPTION OF THE INVENTION

Figure 1:
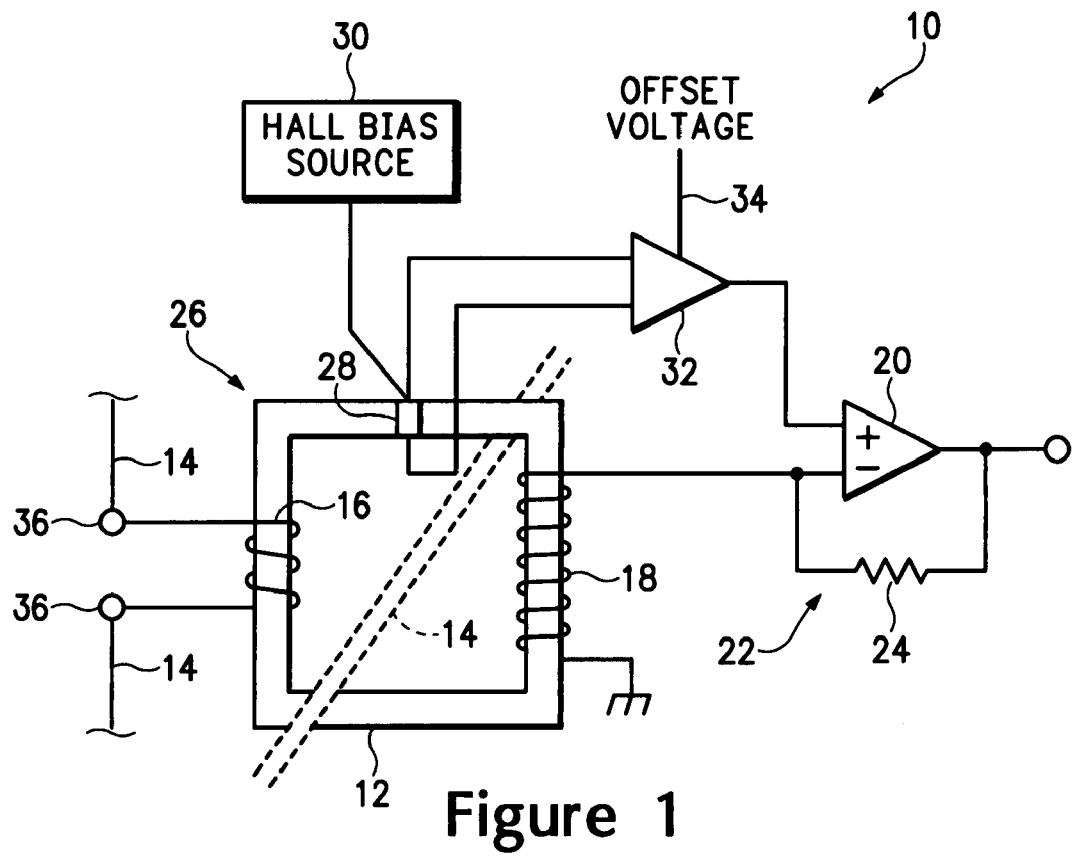
FIG. 1 is a schematic representation of an embodiment of the current sensing circuit according to the present invention.

Referring to FIG. 1, there is shown a schematic representation of an embodiment of a current sensing circuit 10 for detecting current flow in a conductor. The current sensing circuit 10 is contemplated for use in a current measurement probe where the current flowing in a conductor is measured by the probe. The current sensing circuit 10 has a ring-shaped core 12 of magnetic material defining an aperture. A current carrying conductor 14 is coupled in a flux linking relationship with ring-shaped magnetic core 12. The current carrying conductor 14 is preferably linked to the ring-shaped magnetic core 14 via a multi-turn primary winding 16 that is coupled in series with the current carrying conductor 14. Alternately, the current carrying conductor 14 may be inserted through the aperture in the ring-shaped magnetic core 12 and act as the primary winding 16. The current to be measured in the current carrying conductor 14 produces a magnetic flux in the magnetic core 12 and is linked to a multi-turn secondary winding 18. One terminal of the secondary winding 18 is coupled to ground with the other terminal being coupled to the inverting input terminal of a transimpedance amplifier 20. The inverting input terminal of the transimpedance amplifier 20 is coupled to the output terminal of the amplifier 20 via a current signal path 22 having a transimpedance resistor 24. Thus the primary winding 16 or alternately the current carrying conductor 14, the magnetic core 12 and the secondary winding 18 function as a transformer 26. A magneto-electric converter 28 is disposed within the magnetic core 12 substantially perpendicular to the lines of flux in the magnetic core 12. The magneto-electric converter 28 is preferably a thin film semiconductor Hall effect device having a first pair of terminals coupled to a bias source 30 and a second pair of terminals connected to differential inputs of amplifier 32. In the preferred embodiment, the amplifier 32 is a high gain differential amplifier having low noise and high common mode rejection The single ended output of the differential amplifier 32 is coupled to the non-inverting input of the transimpedance amplifier 20. Offset control signals resulting from the degaussing of the current sensing circuit may also be applied to the differential amplifier 32 via an offset voltage line 34.

Figure 2:
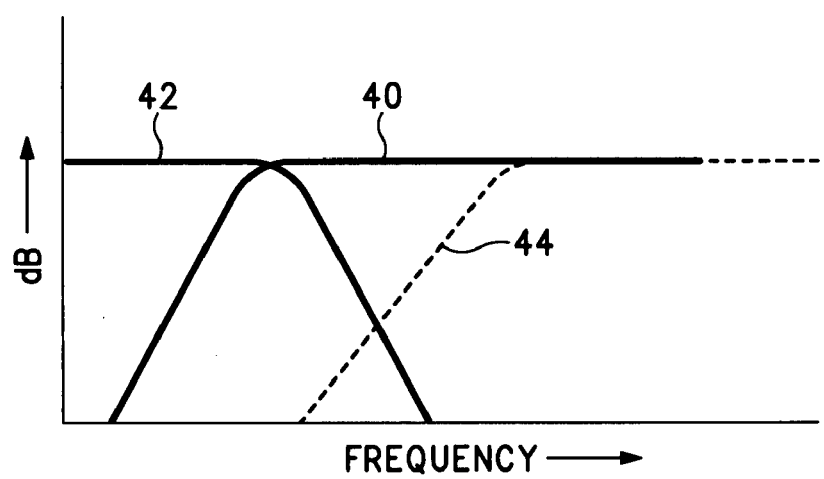
FIG. 2 illustrated respective frequency response curves for the transformer and the combined Hall effect device and amplifier in an embodiment of the current sensing circuit according to the present invention.

Referring to FIG. 2, there is illustrated respective frequency response curves 40, 42 for the transformer 26 and the combined Hall effect device 28 and amplifier 32. The Hall effect device 28 and amplifier combination has an open loop passband that extends from DC to a range of 1 to 2 MHZ. In the preferred embodiment, the high pass 3 dB roll off frequency of the Hall effect device 28 and amplifier 32 is in the range of 1 to 2 KHz. The frequency response curve for the transformer 26 has a low cut-off 3 dB frequency in the same range of 1 to 2 KHz. The design of the current sensing circuit 10 provides a smooth transition from the passband of the combined Hall effect device 28 and amplifier 32 to the passband of the transform 26.

The transform 26 preferably has a 10 to 1 turns ratio from the secondary winding 18 to the primary winding 16 to provide increased sensitivity for current signals in the microamp range. The secondary winding 18 has an inductance of approximately 440 µH as compared to existing current measuring probe, such as the TCP312 Current Probe, manufactured and sold by Tektronix, Inc, Beaverton, Oreg., having a transformer secondary turns winding of 48 and an inductance of 4 mH. Decreasing the inductance of the secondary winding 18 of the transformer 26 without lowering the transformer resistance increases the lower cut-off frequency of the transformer as represented by the dashed line 44 in FIG. 2. This would result in a substantial dip in the crossover region between the combined Hall effect device 28 and amplifier 32 and the transformer 26. Therefore, the use of the transformer 26 having a secondary winding inductance that is an order of magnitude smaller than existing current sensing devices prevents the use of the prior art circuitry that couples a resistance to the secondary winding 18. The transimpedance amplifier 20 present nearly a virtual short circuit (zero ohm load) to the transformer 26 thus extending the transformer 26 lower cut-off frequency and allowing for miniaturizing the transformer size.

The current sensing circuit 10 may be coupled to the current carrying conductor 14 via contacts 36 mounted on the conductor 14, such as manufactured by Amphenal, Corp., Wallingford, Conn. under part number MHC-201. The contact provide a path of current flow through the current carrying conductor 14 during normal operation. When the current sensing circuit 10 is coupled to the current carrying conductor 14 via contact pins coupled to the primary winding 16 of the transformer 26, the current path is diverted to the primary winding of the transformer 26. The current in the primary winding 16 produces a magnetic flux in the magnetic core 12 of the transformer 26 that is linked to the secondary winding 18 and the Hall effect device 28. DC or low frequency components of the current flowing the in the primary winding 16 generate a potential difference between the second pair of terminals of the Hall effect device 28. The voltage output of the Hall effect device 28 is coupled to the differential inputs of the amplifier 32. The output of amplifier 32 is coupled to the non-inverting input of the transimpedance amplifier 20. The changing signal level on the non-inverting input of the transimpedance amplifier 20 caused by the voltage generated by the Hall effect device 28 produces a corresponding change in the output voltage level of the transimpedance amplifier 20. The voltage at the output of the transimpedance amplifier 20 results in a current being generated in the current signal path 22 that is coupled to the secondary winding 18 of the transformer 26. The current flowing in the secondary winding 18 is opposite the current flowing in the primary winding 16 producing a magnetic flux in the magnetic core 12 that nulls the magnetic flux produced by the current flowing in the primary winding 16. This DC to low frequency feedback loop maintains an opposing current through the current signal path 22 that is equal to the DC or low current signal in the primary winding 16 of the transformer 26.

The high frequency components of the current flowing in the primary winding 16 results in a current being induced in the secondary winding 18 in a direction such as to produce a magnetic field in the magnetic core 12 that is opposite to the field created by the current in the primary winding 16. The current induced in the secondary winding 18 is coupled to the inverting input of the transimpedance amplifier 20. Since the inverting input is a virtual ground, the current in the secondary winding 18 is coupled via the current signal path 22 through the transimpedance resistor 24 to the output of the transimpedance amplifier 20 resulting in an amplified voltage output representative of the high frequency components of the current flowing in the primary winding 16.

The transimpedance amplifier 20 functions as both a power amplifier for generating a bucking current for nulling the magnetic flux in the magnetic core 12 at DC to low current frequencies and as a transimpedance amplifier for higher frequencies. The circuit design of the current sensing circuit using the transimpedance amplifier eliminates the need for a power amplifier to generate the bucking currents to null the magnetic flux in the magnetic core 12 caused by DC to low frequency current signals. This reduces the power requirement for the current sensing circuit 10 as compared to previous current sensing circuits used in current measurement probes.

As previously stated, the current carrying conductor 14 may be used as the primary winding 16 in the current sensing device 10. The current carrying conductor 14 is inserted through the aperture in the magnetic core 12. The current flowing in the current carrying conductor 14 induces a magnetic flux in the magnetic core 12 that is sensed by the Hall effect device 28 at DC to low frequencies and induces a current in the secondary winding 18 at higher frequencies. The use of the current carrying conductor 14 as the primary winding 16 of the transformer 26 changes the turns ratio of the transformer from 10 to 1 to 30 to 1. This does result in a decrease in the overall sensitivity of the current sensing circuit. However, the current sensing circuit 10 still provides power savings by incorporating the transimpedance amplifier 20 as both power amplifier for generating a DC to low frequency nulling current and as a voltage gain amplifier for the current being sensed.

It will be obvious to those having skill in the art that many changes may be made to the details of the above-described embodiments of this invention without departing from the underlying principles thereof. The scope of the present invention should, therefore, be determined only by the following claims.

What is claimed is:

1. A current sensing device for detecting current flow in a conductor comprising:
    a magnetic core in linking relationship with the conductor, whereby the flow of current in the conductor produces magnetic flux in the core;
    a magneto-electric converter and a secondary winding being linked by the magnetic flux in the magnetic core with the magneto-electric converter disposed within the magnetic core in a plane substantially perpendicular to the magnetic flux and generating an output responsive to the magnetic flux in the magnetic core that is coupled to an amplifier generating at least a DC output representative of the magneto-electric converter output, and the secondary winding having one end coupled to a ground reference responsive to the magnetic flux in the magnetic core for producing an alternating current output;
    a transimpedance amplifier having an inverting input coupled to receive the alternating current output from the secondary winding, a non-inverting input coupled to receive the output of the magneto-electric converter amplifier and an output coupled to the inverting input via a resistive current signal path wherein the resistive current signal path couples the alternating current in the secondary winding to the output of the transimpedance amplifier and couples a current representing the output the magneto-electric converter amplifier from the output of the transimpedance amplifier to the secondary winding.

2. The current sensing device as recited in claim 1 further comprising a primary winding coupled to the conductor for linking the magnetic core to the flow of current in the conductor.

3. The current sensing device as recited in claim 1 wherein the conductor functions as a primary winding for linking the magnetic core to the flow of current in the conductor.

4. The current sensing device as recited in claim 1 wherein the magneto-electric converter is a Hall effect device.

5. The current sensing device as recited in claim 1 further comprising an offset voltage coupled to the non-inverting input of the transimpedance amplifier.

\* \* \* \* \*